United States Patent [19]
Wong

[11] Patent Number: 5,365,117
[45] Date of Patent: Nov. 15, 1994

US005365117A

[54] LOGIC GATES HAVING FAST LOGIC SIGNAL PATHS THROUGH SWITCHABLE CAPACITORS

[75] Inventor: Robert C. Wong, Poughkeepsie, N.Y.

[73] Assignee: International Business Machines Corporation, Armonk, N.Y.

[21] Appl. No.: 26,653

[22] Filed: Mar. 5, 1993

[51] Int. Cl.⁵ .................. H03K 17/00; H03K 4/00; H03K 12/00
[52] U.S. Cl. .................. 327/374; 327/482; 326/18
[58] Field of Search .............. 307/241, 243, 254, 255, 307/362

[56] References Cited

U.S. PATENT DOCUMENTS

| | | | |
|---|---|---|---|
| 3,622,799 | 11/1971 | Marley | 307/215 |
| 3,636,381 | 1/1972 | Press | 307/243 |
| 3,931,568 | 1/1976 | Jost et al. | 307/255 |
| 3,952,212 | 4/1976 | Matsumoto et al. | 307/255 |
| 4,287,575 | 9/1981 | Eardley et al. | 365/174 |
| 4,306,159 | 12/1981 | Wiedmann | 307/457 |
| 4,480,319 | 10/1984 | Hotta et al. | 365/155 |
| 4,605,870 | 8/1986 | Dansky et al. | 307/443 |
| 4,626,709 | 12/1986 | Mazumder et al. | 307/455 |
| 4,806,799 | 2/1989 | Pelley, III et al. | 307/475 |

OTHER PUBLICATIONS

R. C. Wong, "Current Switches With Speed-Up Junctions" IBM Technical Disclosure Bulletin, vol. 33, No. 4, pp. 450-452, Sep. 1990.

*Primary Examiner*—William L. Sikes
*Assistant Examiner*—Fetsum Abraham
*Attorney, Agent, or Firm*—Charles W. Peterson, Jr.

[57] ABSTRACT

Switchable diffused junction capacitors providing selectable data signal paths in a logic gate. A control circuit, such as a current switch, renders one of the junction capacitors conductive to present a large diffusion capacitance which acts as a fast signal pathway to the respectively applied data signal. Non-conducting junction capacitor presents a negligible diffusion capacitance which essentially acts as an open circuit to the respectively applied data signal. The control circuit response is slow and non-critical. The combination of a slow response control to configure selectable fast response data signal pathways is useful in "half good" or "partial good" semiconductor chip technologies, data buffers with fast flush, and self-test, self-repair chip designs, among others.

7 Claims, 2 Drawing Sheets

LOGIC GATES HAVING FAST LOGIC SIGNAL PATHS THROUGH SWITCHABLE CAPACITORS

BACKGROUND OF THE INVENTION

The invention generally relates to logic gates with complex functions and, more particularly, to such gates presenting essentially no logic signal delay penalty.

Emitter-dots and collector-dots have been very useful in providing simple and fast OR/AND functions in bipolar designs. However, the input signals must be limited to a single fanout. In case of collector-dots, level clamps are generally needed to prevent excessive down levels, and the clamps introduce extra delay penalty. With the ever-increasing scale of chip integration, chip reconfiguration controls become essential for yield, testability and reliability-serviceability-availability. The flexibility of variable logic configurations, however, is at a cost of delay penalties due to the extra control logic, some of which lies in the logic signal path. Consider, for example, the prior art cascode emitter-coupled logic (ECL) selector circuit of FIG. 1. The selector signal CT determines which transistor 1 or 2 of current switch 3 and which current switch 6 or 9 are turned on. Logic signal A determines the conduction levels of transistors 4 and 5 when current switch 6 operates. Similarly, logic signal B determines the conduction levels of transistors 7 and 8 when current switch 9 is turned on.

In operation, selector signal CT is essentially a DC control signal and, therefore, need not be applied to a circuit having an extremely short response time. Thus, the relatively slow switching time of current switch 3 is largely irrelevant and can be tolerated in many common applications. The same is not true of the signal pathways for rapidly changing logic signals A and B. Here, fast, substantially zero signal transfer delay is desired from the respective input terminal to shared output terminal 10. It will be noted, however, that current switch 6 lies within the signal pathway of logic signal A whereas current switch 9 is in the path of logic signal B. The result not only is a delay (tolerable) in the control signal response but also similar delays (objectionable) in the logic signal responses. The delays from any of the inputs A, B, or CT to the output (10) are typically about 100 picoseconds in the advanced bipolar technologies.

Attempts have been made in the art to reduce the delay encountered in logic circuits due to transistor switching. "Speed-up" or "overdrive" capacitors have been added to switching circuits to force transistors to switch more rapidly. Examples of such techniques are disclosed in U.S. Pat. No. 4,306,159 issued to Siegfried K. Wiedmann on Dec. 15, 1981; U.S. Pat. No. 4,605,870 issued to Allan H. Dansky et al. on Aug. 12, 1986; U.S. Pat. No. 4,626,709 issued to Nikhil C. Mazumder et al. on Dec. 2, 1986, and IBM ® Technical Disclosure Bulletin, "Current Switches with Speed-Up Junctions" by R. C. Wong, Vol. 33, No. 4, Sep. 1990, pp. 450–452. Although some improvement is achieved in switching speed by the speed-up capacitor schemes, the limiting factor, i.e., the switching transistor per se, is not eliminated.

Thus, it is desirable to provide the flexibility of variable logic configurations by means of controlled circuits which can be as fast as prior emitter dots without incurring the delay penalties due to the extra control circuits necessary to realize the more sophisticated functions such as, for example, select, exclusive OR and latch.

SUMMARY OF THE INVENTION

One object of the invention is to provide a flexible logic circuit having substantially no delay penalty in the logic signal pathway.

Another object of the invention is to provide a fast logic circuit capable of performing functions such as select, exclusive OR and latch and having no switching transistors in the logic signal pathway.

A further object is to provide a transistorless switching circuit component for use in logic signal pathways having substantially no delay penalty.

These and other objects of the present invention are achieved by dotting the anode of a p-n junction switchable diode with the anodes of one or more other switchable diodes. Only one of the switchable diodes is conducting at a time, under the control of a configuration control switching transistor connected outside the logic signal path that includes the conducting diode. All other diodes are turned off and present negligible capacitance. The conducting diode, on the other hand, presents a large diffusion capacitance and functions as a simple, no-delay conductor within the logic signal path.

DESCRIPTION OF THE PREFERRED EMBODIMENTS

Figure 1:
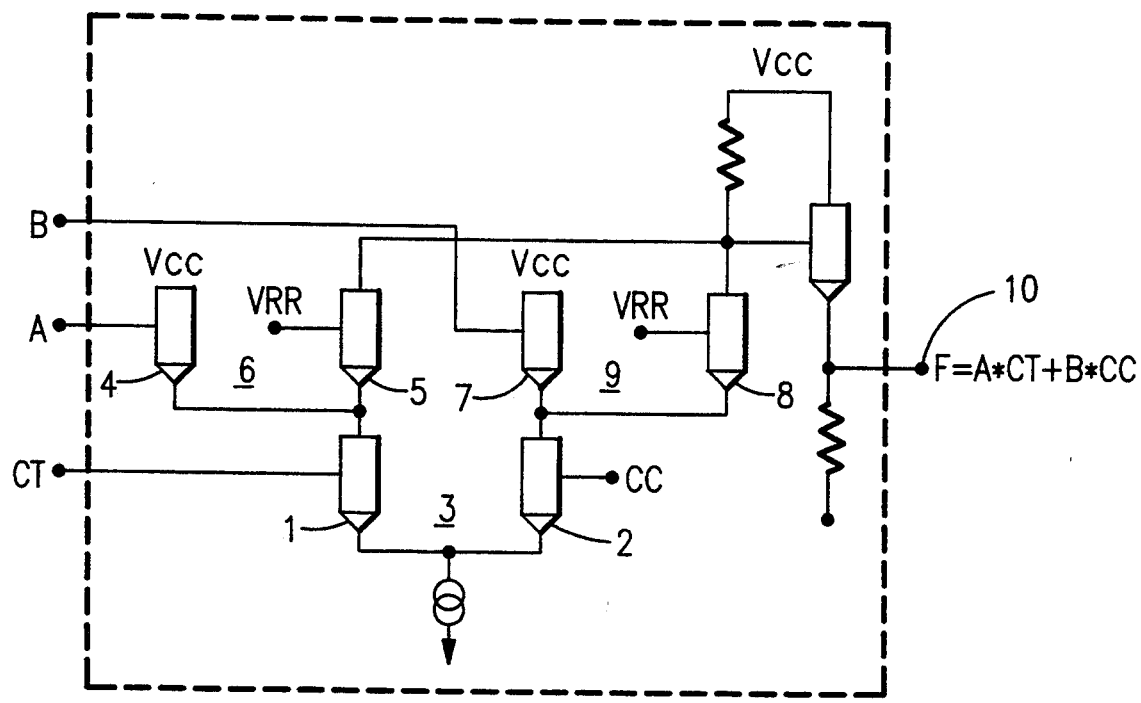
FIG. 1 is a schematic diagram of a conventional ECL selector circuit.

As previously discussed, the prior art selector of FIG. 1 suffers a logic signal delay penalty as a result of the inclusion of current switch 6 in the path of logic input A and current switch 9 in the path of logic input B. A is selected when CT is up and B is selected when CT is down. The signal delays from any of the inputs A, B and CT to the output F are typically about 100 picoseconds in the advanced bipolar technologies.

Figure 2:
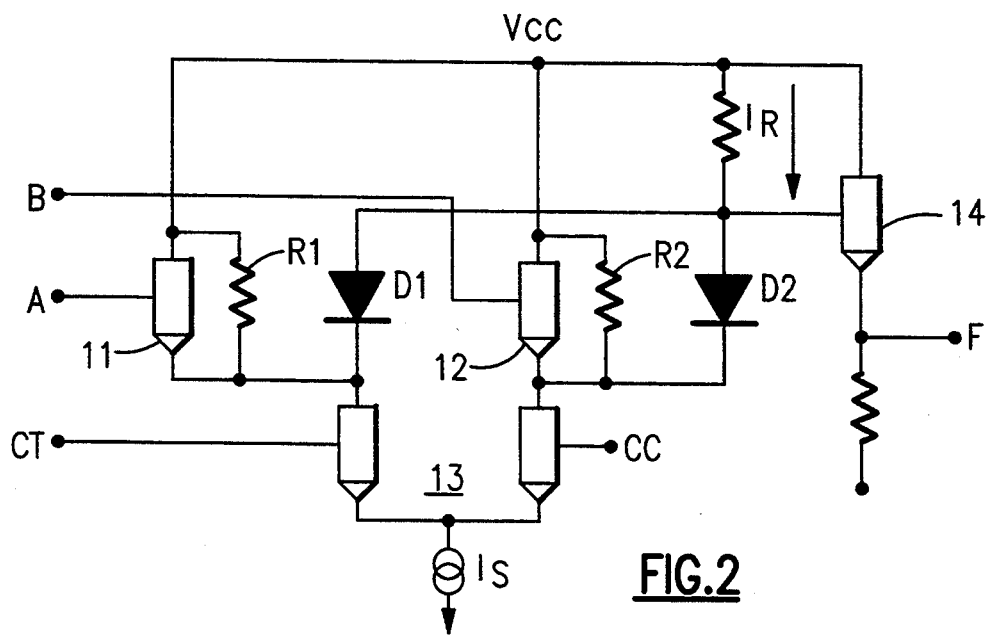
FIG. 2 is a schematic diagram of a selector circuit with fast logic paths in accordance with the present invention.

In accordance with the present invention, and as shown in FIG. 2, diffused junction capacitors D1 and D2 are substituted for switching transistors 5 and 8 of FIG. 1 and emitter follower transistors 11 and 12 with resistors $R_1$ and $R_2$ are substituted for switching transistors 4 and 7 of FIG. 1, thereby eliminating current switches 6 and 9 of FIG. 1. As will be seen, the cited substitutions effectively eliminate the delay of A or B to F. D1 and D2 are large capacitors formed of respective PN junctions when rendered conductive. When true configuration control signal CT is up, the capacitance of conducting junction D1 is very large and the capacitance of non-conducting junction D2 is about zero. Thus, input A is then effectively directly connected to F, with a signal delay of about 20 picoseconds or less. Likewise, when CT is down, the capacitance of non-conducting junction D1 is about zero and the capacitance of conducting junction D2 is very large. Consequently, input B is then coupled to F with no data signal path delay.

It should be noted that CT is a DC control signal which determines the switching of configuration control current switch 13 but does not propagate through any critical logic signal path. Actually, the true and the complement of a configuration control signal (respectively CT and CC) are applied to the lower level inputs of the selector circuit. $R_1$ and $R_2$ are used to discharge the diffusion capacitance of D1 or D2 when the forward conducting current is cut off from the cathode. A DC source (Vcc) supplies the diode current to the dotted anodes as well as the base drive of the emitter follower 14.

In state-of-the-art bipolar chip technology, the delay for input A or B through the circuit of FIG. 2 is about 20 to 40 picoseconds as compared to 100 to 130 picoseconds with the circuit of FIG. 1 for a load of about 0.5 picofarads. The diffusion capacitance of each of D1 and D2 when conducting is about 35 picofarads for a diode current of 90 microamps. The total power-delay product is improved by about five times (with the assumption that the slow delay path for CT or CC is not critical). The slow path delay is about 10 nanoseconds. The slow path delay can be reduced by shifting the levels of operating currents. In the cascode circuit of FIG. 2, the upper (A, B) and lower (CT, CC) levels of signals must be separated sufficiently to avoid saturation. The upper level transistor 11 or 12 may remain conductive regardless of whether the respective input signal A or B is up or down. It should be noted that the output levels (at F) are shifted down by one Vbe from the input levels.

Figure 3:
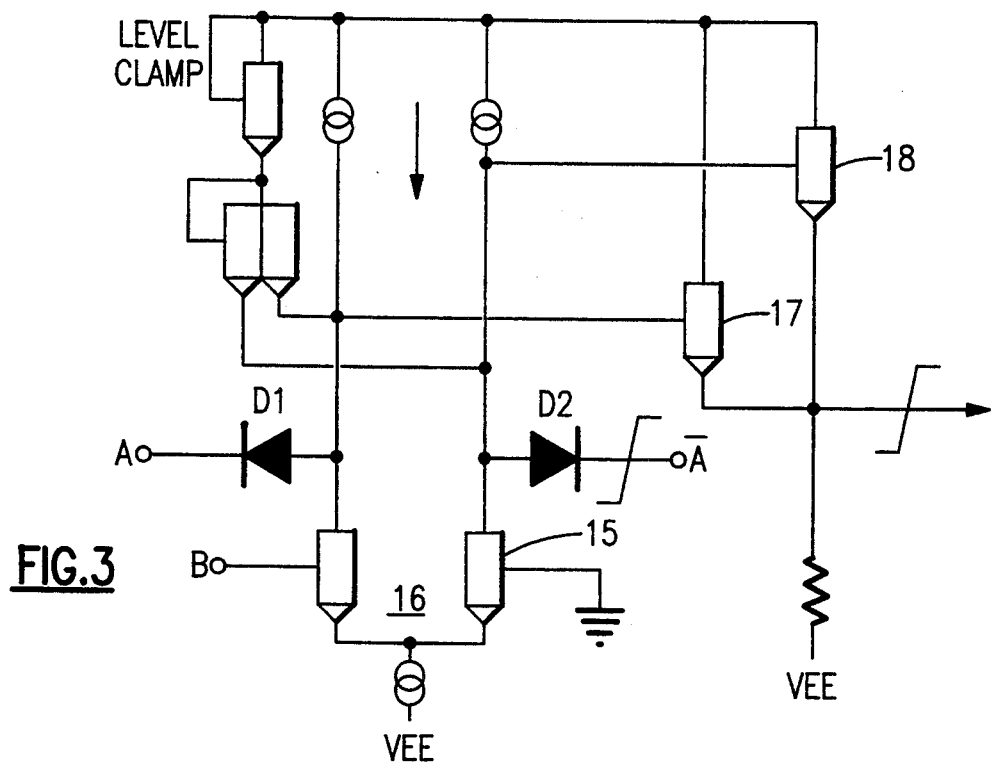
FIG. 3 is a schematic diagram of an exclusive OR modification of FIG. 2 wherein the input and output signal swings are about the same voltage level.

The selector circuit of FIG. 2 becomes the exclusive OR circuit if B becomes the complement of A, CT becomes B, and CC becomes the complement of B. The output level shift down by one Vbe of FIG. 2 is eliminated in FIG. 3. With the elimination of emitter followers 11 and 12 of FIG. 2, and the grounding of the base of transistor 15 of configuration control current switch 16 of FIG. 3, both the input and output signal level swings are around ground. In order to isolate the inputs A and $\overline{A}$ in the absence of emitter followers 11 and 12 in FIG. 2, it becomes necessary in FIG. 3 to reposition diodes D1 and D2 and to introduce an emitter follower into each diode output circuit (17, 18) as shown.

Figure 4:
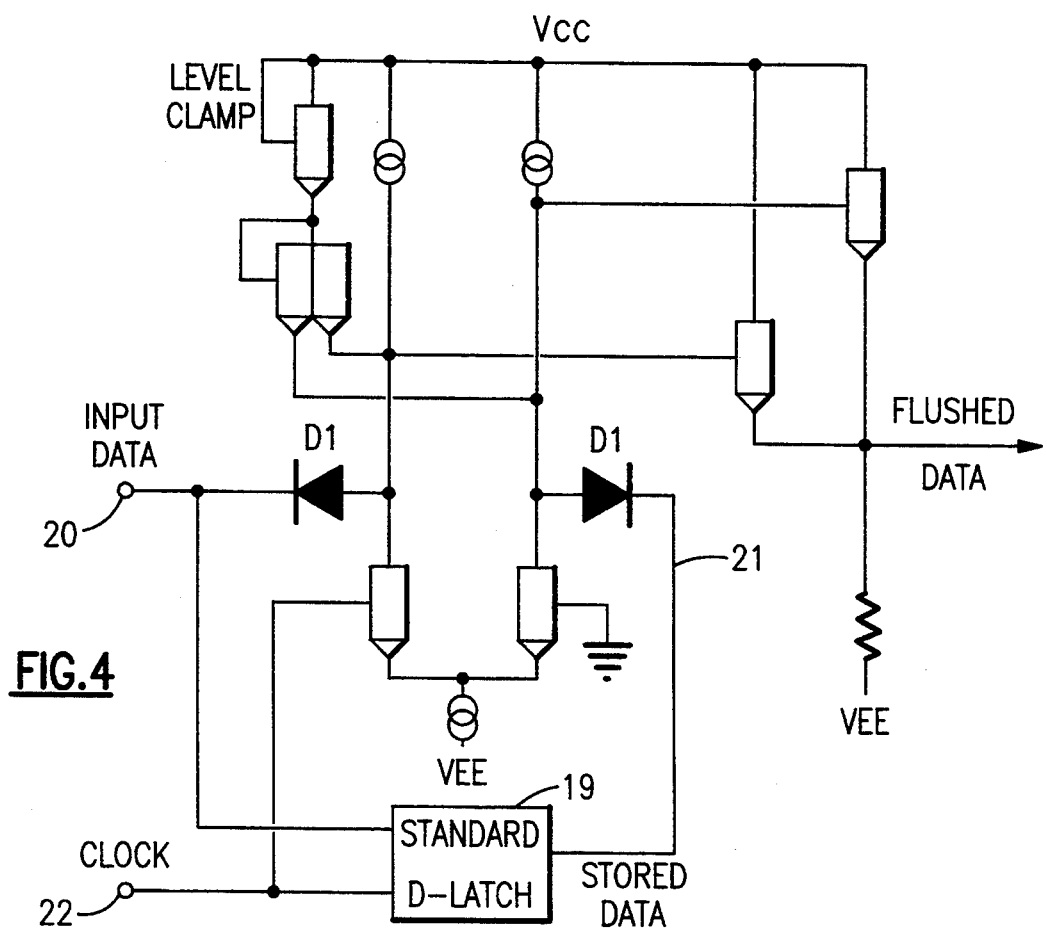
FIG. 4 is a schematic diagram of a gated latch species of the invention.

A polarity hold latch with fast flush path is represented in FIG. 4. A conventional D-latch 19 is connected to the data inputs 20 and 21 and to the clock input 22 so that data can be directly propagated. In the latched mode when the clock is inactive down, the direct path is blocked and data must be provided from the prestored latch.

In each of the foregoing described species of the present invention, only the switched diffused junction capacitors and not the configuration control current switches are positioned within the high speed data signal path. The configuration control switches are used only to set up a logic configuration in response to relatively slow control signals. There are a number of instances wherein such "fast" data signals and "slow" control signals are encountered. For example, in a so-called "half good" chip design, the inputs and outputs of the two halves must be quickly selected according to a DC signal indicating which half is good. A second example is in the part number control of the "partial good" chips. The address of the defective portion is represented by DC signals that must be quickly compared during normal operations. These DC signals are either preset at the chip pads or from fuses or internal latches. Another example is in buffers where data must quickly flush through for fast access and yet the flush mode can be set up with less urgency. Many other situations in need of "fast" data and "slow" control signal response can be found in designs with self-test and self-repair features.

A variety of diffused junction capacitors suitable for use with the present invention can be formed from bipolar transistors by shorting together two of the three electrodes or by simply using the base and only one of the other two electrodes. Of course, conventional diffused junction diodes also can be used.

Various modifications and alterations will occur to a person of ordinary skill in the art without departing from the scope and spirit of the present invention.

What is claimed is:

1. A selectable data coupling circuit comprising
   a first terminal for receiving control signals;
   a plurality of second terminals for receiving a plurality of data signals;
   a plurality of diffused junction capacitors, each having a large diffusion capacitance when rendered conductive and a negligible diffusion capacitance when rendered non-conductive;
   circuit means connected to each said capacitor for rendering one of said capacitors conductive in response to said control signal; and
   a plurality of data signal pathways, each said capacitor being connected between a respective one of said second terminals and a respective one of said pathways,
   said control signals being applied to said circuit means.

2. The coupling circuit defined in claim 1 wherein said circuit means is a current switch.

3. The coupling circuit defined in claim 2 wherein said current switch has a pair of output terminals,
   each said capacitor being connected between a respective one of said output terminals and a respective one of said second terminals.

4. The coupling circuit defined in claim 2 wherein said current switch has a pair of output terminals,
   each said capacitor being connected between a respective one of said output terminals and a respective one of said pathways.

5. The coupling circuit defined in claim 1 and further including
   means for coupling said pathways together.

6. The coupling circuit defined in claim 1 wherein each said capacitor is a bipolar transistor having emitter, base and collector electrodes, two of said electrodes being shorted together.

7. The coupling circuit defined in claim 1 wherein each said capacitor is a p-n junction of a bipolar transistor, said junction existing between the base and one of the emitter and collector thereof.

* * * * *